United States Patent
Yang et al.

(10) Patent No.: US 9,406,685 B2
(45) Date of Patent: Aug. 2, 2016

(54) FLASH MEMORY UNIT AND MEMORY ARRAY, AND PROGRAMMING, ERASING AND READING METHOD THEREOF

(71) Applicant: Shanghai Huahong Grace Semiconductor Manufacturing Corporation, Shanghai (CN)

(72) Inventors: Guangjun Yang, Shanghai (CN); Jian Hu, Shanghai (CN); Jun Xiao, Shanghai (CN); Binghan Li, Shanghai (CN); Hong Jiang, Shanghai (CN); Weiran Kong, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/583,927

(22) Filed: Dec. 29, 2014

(65) Prior Publication Data

US 2016/0148942 A1    May 26, 2016

(30) Foreign Application Priority Data

Nov. 24, 2014  (CN) .......................... 2014 1 0681725

(51) Int. Cl.
| | |
|---|---|
| *G11C 16/04* | (2006.01) |
| *H01L 27/115* | (2006.01) |
| *G11C 16/14* | (2006.01) |
| *G11C 16/26* | (2006.01) |
| *G11C 16/10* | (2006.01) |

(52) U.S. Cl.
CPC ...... *H01L 27/11521* (2013.01); *G11C 16/0408* (2013.01); *G11C 16/14* (2013.01); *G11C 16/26* (2013.01); *G11C 16/0425* (2013.01); *G11C 16/10* (2013.01)

(58) Field of Classification Search
CPC ............ H01L 27/11521; H01L 27/115; H01L 21/28273; H01L 29/42324; H01L 29/788; G11C 16/10; G11C 16/0458; G11C 16/26; G11C 16/0425; G11C 16/0441; G11C 16/0408
USPC ............. 365/185.01, 185.29, 185.18, 185.14; 247/316, 315, 326
See application file for complete search history.

(56) References Cited

U.S. PATENT DOCUMENTS

| | | | | |
|---|---|---|---|---|
| 7,800,159 | B2 * | 9/2010 | Widjaja ................ | H01L 27/115 257/315 |
| 8,693,243 | B2 * | 4/2014 | Gu .................... | H01L 21/28273 365/185.01 |

* cited by examiner

*Primary Examiner* — David Lam
(74) *Attorney, Agent, or Firm* — Harness, Dickey & Pierce, P.L.C.

(57) ABSTRACT

A flash memory unit, a memory array and operation methods thereof are provided. The flash memory unit includes a semiconductor substrate, a first and a second bit line structures, a word line structure, a first and a second float gates, and a first and a second control gates. The semiconductor substrate has doping wells formed therein, constituting a source and a drain. The first and second bit line structures are respectively connected with the source and the drain. The word line structure is disposed between the first and second bit line structures. The first float gate is disposed between the first bit line structure and the word line, and the second float gate is disposed between the second bit line structure and the word line. The first control gate is disposed on the first float gate, and the second control gate is disposed on the second float gate.

7 Claims, 2 Drawing Sheets

FLASH MEMORY UNIT AND MEMORY ARRAY, AND PROGRAMMING, ERASING AND READING METHOD THEREOF

CROSS-REFERENCE TO RELATED APPLICATIONS

The present application claims priority to Chinese patent application No. 201410681725.1, filed on Nov. 24, 2014, and entitled "FLASH MEMORY UNIT AND MEMORY ARRAY, AND PROGRAMMING, ERASING AND READING METHOD THEREOF", the entire disclosure of which is incorporated herein by reference.

TECHNICAL FIELD

The present disclosure generally relates to memory technology, and more particularly, to a flash memory unit, a memory array and their programming, erasing and reading methods.

BACKGROUND

Electrically Erasable Programmable Read-Only Memories (EEPROM) are a kind of semiconductor memory device which has a minimum operation unit of byte, and can be electrically written repeatedly. Compared with Erasable Programmable Read-Only Memories (EPROM), information of the EEPROMs can be erased through a specific voltage without ultraviolet irradiation and dismantling, so that new data can be written. Because of excellent performances and conveniences for online operations, the EEPROMs are widely used in BIOS chips and flash memory chips which are erased frequently, and are gradually replacing parts of Random Access Memories (RAM), which have to retain data in power-off time, and even parts of hard disks. The EEPROMs and high-speed RAMs have been two most popular and fastest-growing storage technologies of the twenty-first century.

Flash memory is a kind of flash memory. A flash memory usually includes a decoding circuit, a control circuit and a storage array. The storage array of the flash memory includes a plurality of storage units arranged in rows and columns. FIG. 1 illustrates a cross-sectional diagram of two adjacent storage units in a conventional flash memory storage array. Referring to FIG. 1, each storage unit includes a substrate 10, a drain electrode 11, a source electrode 12, a floating gate FG and a word line WL. Specifically, the drain electrode 11 and the source electrode 12 are formed in the substrate 10, the drain electrode 11 is connected with a bit line BL on a surface of the substrate 10, the source electrode 12 is connected with a source line SL on the surface of the substrate 10, the gate electrode is disposed between the source line SL and the bit line BL and is connected with the word line WL, and the floating gate FG is disposed on a part of the surface of the substrate 10 between the word line WL connected with the gate electrode and the bit line BL connected with the drain electrode 11.

Conventionally, in a flash memory, there is only one row of memory units which share the same source line being used for data storage, which leads to low usage rate of the memory units. Too many idle memory units occupy a large space. Therefore, the flash memory may have a large size but a low programming speed.

SUMMARY

The present disclosure provides a memory device with reduced size and improved programming speed.

According to one embodiment, a flash memory unit is provided, including a semiconductor substrate, a first bit line structure and a second bit line structure, a word line structure, a first float gate and a second float gate, and a first control gate and a second control gate;

wherein the semiconductor substrate has doping wells formed therein, the doping wells constitute a source and a drain;

wherein the first bit line structure and the second bit line structure are disposed on the semiconductor substrate and respectively connected with the source and the drain;

wherein the word line structure is disposed on the semiconductor substrate and between the first bit line structure and the second bit line structure;

wherein the first float gate is disposed on the semiconductor substrate and between the first bit line structure and the word line, and the second float gate is disposed on the semiconductor substrate and between the second bit line structure and the word line;

wherein the first control gate is disposed on the first float gate, and the second control gate is disposed on the second float gate.

In some embodiments, a word line dielectric layer is disposed between the word line structure and the semiconductor substrate.

In some embodiments, a float gate dielectric layer is disposed between the semiconductor substrate and each of the first and the second float gates.

In some embodiments, the semiconductor substrate is a P-type substrate, and the doping wells are N-type wells.

In some embodiments, two control gate dielectric layers are respectively disposed between the first control gate and the first float gate, and between the second control gate and the second float gate.

In some embodiments, the flash memory unit further includes a substrate line structure disposed on the semiconductor substrate.

According to one embodiment, a memory array is provided, including a plurality of memory units arranged in M rows and N columns, 2N bit lines, M word lines, and 2M control lines, where M≥1, N≥1, and N is an integer multiple of 8;

wherein the memory units are any of the above described memory units;

wherein for the memory units in the $n^{th}$ column, where $1 \le n \le N$, bit line structures thereof are respectively connected to two bit lines in the memory array;

wherein for the memory units in the same row, word line structures thereof are connected to one word line in the memory array, and control gates thereof are respectively connected to two control gate lines in the memory array.

In some embodiments, the memory array further includes M substrate lines each of which is connected to the semiconductor substrates in the memory units in the same row.

According to one embodiment, a programming method of the above stated memory array is provided, including:

applying a voltage ranging from 4V to 6V to bit lines connected with bit line structures to be programmed in memory units to be programmed;

applying a current ranging from 1 µA to 5 µA to bit lines connected with bit line structures not to be programmed in the memory units to be programmed;

applying a voltage of 8V to control gate lines connected with control gates disposed besides the bit line structures to be programmed in the memory units to be programmed;

applying a voltage of 5V to control gate lines connected with control gates disposed besides the bit line structures not to be programmed in the memory units to be programmed;

applying a voltage of 1.5V to word lines connected with word line structures in the memory units to be programmed;

applying a voltage of 0V to bit lines which are not connected with the bit line structures in the memory units to be programmed;

applying a voltage of 0V to control gate lines which are not connected with the control gates in the memory units to be programmed; and applying a voltage of 0V to word lines which are not connected with the word line structures in the memory units to be programmed.

In some embodiments, the bit line structure to be programmed in each of the memory units to be programmed is selected from the first bit line structure and the second bit line structure.

According to one embodiment, an erasing method of the above stated memory array is provided, including:

applying a voltage of 0V to bit lines connected with bit line structures in memory units to be erased;

applying a voltage of −7V to control gate lines connected with control gates in the memory units to be erased;

applying a voltage of 8V to word lines connected with word line structures in the memory units to be erased;

applying a voltage of 0V to bit lines which are not connected with the bit line structures in the memory units to be erased;

applying a voltage of 0V to control gate lines which are not connected with the control gates in the memory units to be erased; and applying a voltage of 0V to word lines which are not connected with the word line structures in the memory units to be erased.

According to one embodiment, a reading method of the above stated memory array is provided, including:

applying a voltage of 0V to bit lines connected with bit line structures to be read in memory units to be read;

applying a voltage of 0.8V to bit lines connected with bit line structures not to be read in the memory units to be read;

applying a voltage of 0V to control gate lines connected with control gates disposed besides the bit line structures to be read in the memory units to be read;

applying a voltage of 4V to control gate lines connected with control gates disposed besides the bit line structures not to be read in the memory units to be read;

applying a voltage of 4.5V to word lines connected with word line structures in the memory units to be read;

applying a voltage of 0V to bit lines which are not connected with the bit line structures in the memory units to be read;

applying a voltage of 0V to control gate lines which are not connected with the control gates in the memory units to be read; and applying a voltage of 0V to word lines which are not connected with the word line structures in the memory units to be read.

In some embodiments, the bit line structure to be read in each of the memory units to be read is selected from the first bit line structure and the second bit line structure.

According to one embodiment, an erasing method of the above stated memory array is provided, including:

applying a voltage of −2V to bit lines connected with bit line structures in memory units to be erased;

applying a voltage of −7V to control gate lines connected with control gates in the memory units to be erased;

applying a voltage of 8V to word lines connected with word line structures in the memory units to be erased;

applying a voltage of −2V to substrate lines connected with semiconductor substrates in the memory units to be erased;

applying a voltage of 0V to bit lines which are not connected with the bit line structures in the memory units to be erased;

applying a voltage of 0V to control gate lines which are not connected with the control gates in the memory units to be erased; and applying a voltage of 0V to word lines which are not connected with the word line structures in the memory units to be erased.

Embodiments of the present disclosure may have advantages as follows.

In the flash memory unit, there are two bits respectively corresponding to the two bit line structures and the two control gates. Therefore, to provide the same storage space, the flash memory unit and the memory array in the present disclosure can have a smaller size.

Further, as the flash memory unit includes two control gates respectively connected to two control gate lines, each of the control gates can be controlled without effecting the other control gate in the same unit, which means each of the two bits can be operated separately.

During a programming process, in the memory units to be programmed, currents are provided to the bit lines connected with the bit line structures not to be programmed, for supplying adequate electrons. Therefore, enough electrons can be transferred to the float gates corresponding to the memory units to be programmed within a short time period. In such way, programming speed can be raised.

DETAILED DESCRIPTION

In order to clarify the objects, characteristics and advantages of the disclosure, the embodiments of the present disclosure will be described in detail in conjunction with the accompanying drawings.

Figure 1:
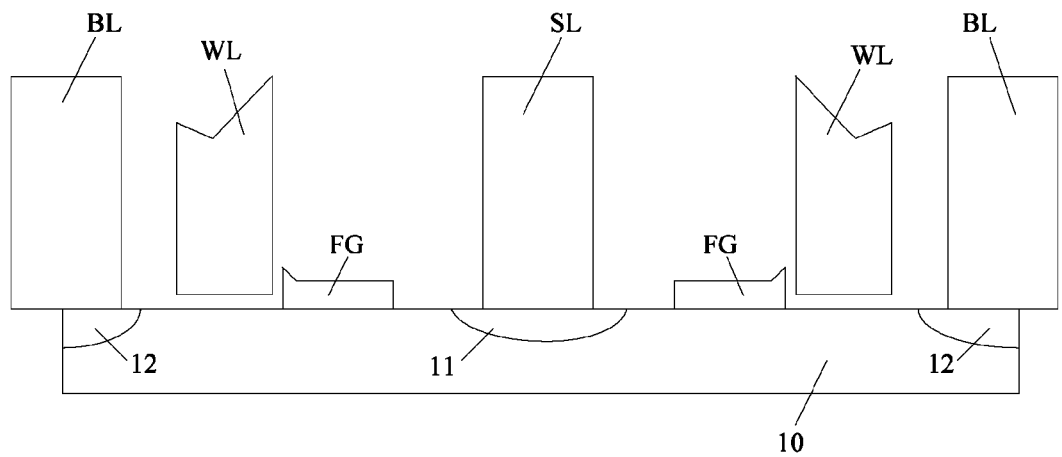
FIG. 1 schematically illustrates a cross-sectional view of a conventional flash memory structure.
Figure 2:
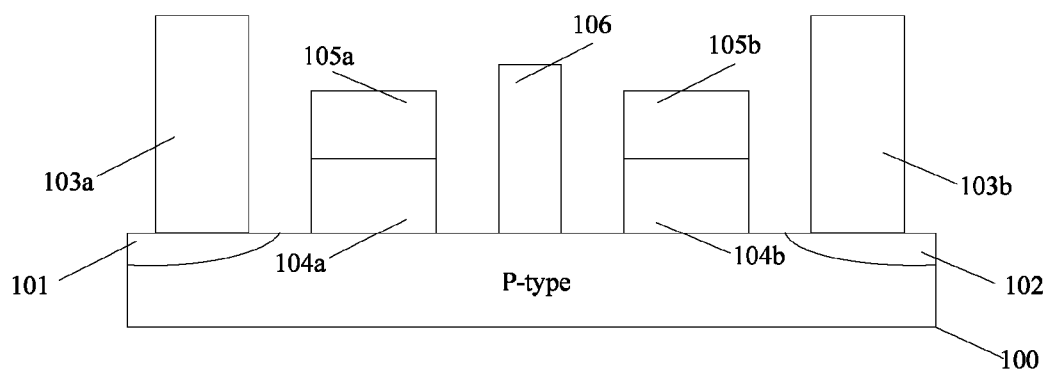
FIG. 2 schematically illustrates a cross-sectional view of a flash memory unit according to one embodiment of the present disclosure.

As shown in FIG. 2, in one embodiment of the present disclosure, a flash memory unit may include a semiconductor substrate 100 in which a first doping well 101 and a second doping well 102 are formed. On the semiconductor substrate 100, there are formed a first and a second bit line structures 103*a* and 103*b* which are respectively connected with the first doping well 101 and the second doping well 102. Further, the flash memory unit may include a first float gate 104*a*, a second float gate 104*b*, a first control gate 105*a*, a second control gate 105*b* and a word line structure 106, which are on the semiconductor substrate 100.

The word line structure 106 is disposed between the first and the second bit line structures 103*a* and 103*b*. The first control gate 105*a* is formed on the first float gate 104*a*, constituting a first stack disposed between the first bit line structure 103*a* and the word line structure 106. The second control gate 105*b* is formed on the second float gate 104*b*, constituting a second stack disposed between the second bit line structure 103*b* and the word line structure 106.

Specifically, in the embodiment illustrated in FIG. 2, the semiconductor substrate 100 may be a P-type substrate. Accordingly, the first doping well 101 and the second doping well 102 are N-type wells.

In some embodiments, the first and the second bit line structures 103*a* and 103*b* may include metal material.

In some embodiments, a word line dielectric layer may be formed between the word line structure 106 and the semiconductor substrate 100. The word line structure 106 may include polysilicon, while the word line dielectric layer may include silicon nitride or silicon oxide.

In some embodiments, a float gate dielectric layer may be formed between the semiconductor substrate 100 and each of the float gates 104*a* and 104*b*. The float gates 104*a* and 104*b* may include polysilicon, and the float gate dielectric layer may include silicon nitride or silicon oxide.

In some embodiments, insulation material may be filled between the first bit line structure 103*a* and the first stack, between the first stack and the word line structure 106, between the word line structure 106 and the second stack, and between the second stack and the second stack and the second bit line structure 103*b*.

Based on the above description, those skilled in the art may be easily conceived to form the above structures, while will not be illustrated in detail here.

The present disclosure further provides a memory array including a plurality of the above described flash memory units. In some embodiments, the memory array may include a plurality of memory units arranged in M rows and N columns, 2N bit lines, where M≥1, N≥1, and N is an integer multiple of 8.

For the memory units in the $n^{th}$ column, where 1≤n≤N, their bit line structures are respectively connected to two bit lines in the memory array. For the memory units in the same row, their word line structures are connected to the same word line in the memory array, and their control gates are connected to the same control gate line in the memory array.

Figure 3:
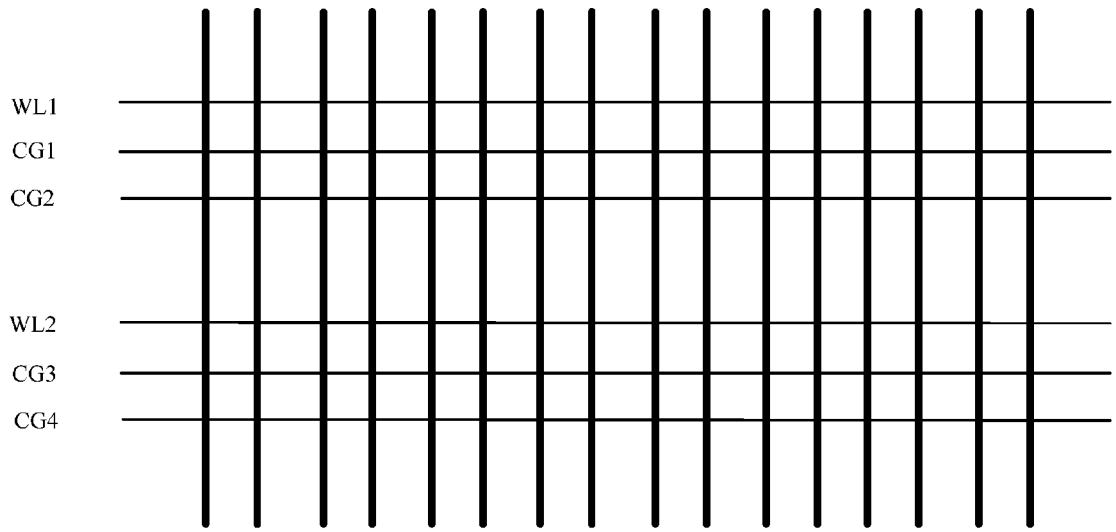
FIG. 3 schematically illustrates a memory array according to one embodiment of the present disclosure.

Specifically, suppose M=2 and N=8, the memory array will be further illustrated in detail hereinafter. FIG. 3 schematically illustrates a memory array including memory units arranged in 2 rows and 8 columns, 16 bit lines, 4 control gate lines and 2 word lines. It should be noted, FIG. 3 just illustrates the bit lines, word lines and control gate lines in the memory array, but shows no memory units, for better illustrating the structure of the memory array.

The 16 bit lines are divided into two groups, the first group including BL1-BL8, and the second group including BL1'-BL8'. The bit line structures of the memory units in the first row are respectively connected with BL1 and BL1', and connection mode of the other bit line structures can be deduced from this. When the bit line structures connected with the first group bit lines BL1-BL8 are to be programmed, the bit line structures connected with the second group bit lines BL1'-BL8' are not to be programmed.

The four control gate lines are CG1, CG2, CG3 and CG4. CG1 and CG2 are respectively connected with the two control gates of each memory unit arranged in the first row, while CG3 and CG4 are respectively connected with the two control gates of each memory unit arranged in the second row.

The two word lines are WL1 and WL2, respectively connected with the word line structures in the first row and the word line structures in the second row.

Further, operation methods of the above stated memory array are provided, including a programming method, an erasing method and a reading method.

In one embodiment, the programming method of the memory array may include:

applying a voltage ranging from 4V to 6V to bit lines connected with bit line structures to be programmed in memory units to be programmed;

applying a current ranging from 1 μA to 5 μA to bit lines connected with bit line structures not to be programmed in the memory units to be programmed;

applying a voltage of 8V to control gate lines connected with control gates disposed besides the bit line structures to be programmed in the memory units to be programmed;

applying a voltage of 5V to control gate lines connected with control gates disposed besides the bit line structures not to be programmed in the memory units to be programmed;

applying a voltage of 1.5V to word lines connected with word line structures in the memory units to be programmed;

applying a voltage of 0V to bit lines which are not connected with the bit line structures in the memory units to be programmed;

applying a voltage of 0V to control gate lines which are not connected with the control gates in the memory units to be programmed; and applying a voltage of 0V to word lines which are not connected with the word line structures in the memory units to be programmed.

As such, the voltage applied to the control gate will be coupled to the corresponding float gate. Under the effect of an electric field generated between the bit line and the float gate, gate induced drain leakage (GIDL) may occur and electrons will transfer into the float. In such way, programming is realized.

In some embodiments, the memory array may be a flash memory array in which each 8 bits, corresponding to 8 stacks of float gates and control gates, constitute one byte. During the operation of the flash memory array, the memory units are operated byte by byte. For example, as shown in FIG. 3, components corresponding to CG1, CG2, WL1 and BL1-BL8 define one byte, components corresponding to CG1, CG2, WL1 and BL1'-BL8', components corresponding to CG3, CG4, WL2 and BL1-BL8 define one byte, and components corresponding to CG3, CG4, WL2 and BL1'-BL8' define one byte. In conclusion, the array illustrated in FIG. 3 can provide memory space for four bytes. Hereinafter, operations to the byte corresponding to CG1, CG2, WL1 and BL1-BL8 will be illustrated. The programming operation may be performed as follows:

applying a voltage ranging from 4V to 6V to BL1-BL8;
applying a current ranging from 1 μA to 5 μA to BL1'-BL8';
applying a voltage of 8V to CG1;
applying a voltage of 5V to CG2;
applying a voltage of 1.5V to WL1;
applying a voltage of 0V to CG3 and CG4; and
applying a voltage of 0V to WL2.

In one embodiment, the erasing method of the memory array may include:

applying a voltage of 0V to bit lines connected with bit line structures in memory units to be erased;

applying a voltage of −7V to control gate lines connected with control gates in the memory units to be erased;

applying a voltage of 8V to word lines connected with word line structures in the memory units to be erased;

applying a voltage of 0V to bit lines which are not connected with the bit line structures in the memory units to be erased;

applying a voltage of 0V to control gate lines which are not connected with the control gates in the memory units to be erased; and applying a voltage of 0V to word lines which are not connected with the word line structures in the memory units to be erased.

Specifically, referring to FIG. 3, the erasing operation to the byte corresponding to CG1, CG2, WL1 and BL1-BL8 may be performed as follows.

applying a voltage of 0V to BL1-BL8, and BL1'-BL8';
applying a voltage of −7V to CG1 and CG2;
applying a voltage of 8V to WL1;
applying a voltage of 0V to CG3 and CG4; and
applying a voltage of 0V to WL2.

In one embodiment, the reading method of the memory array may include:

applying a voltage of 0V to bit lines connected with bit line structures to be read in memory units to be read;

applying a voltage of 0.8V to bit lines connected with bit line structures not to be read in the memory units to be read;

applying a voltage of 0V to control gate lines connected with control gates disposed besides the bit line structures to be read in the memory units to be read;

applying a voltage of 4V to control gate lines connected with control gates disposed besides the bit line structures not to be read in the memory units to be read;

applying a voltage of 4.5V to word lines connected with word line structures in the memory units to be read;

applying a voltage of 0V to bit lines which are not connected with the bit line structures in the memory units to be read;

applying a voltage of 0V to control gate lines which are not connected with the control gates in the memory units to be read; and applying a voltage of 0V to word lines which are not connected with the word line structures in the memory units to be read.

Specifically, referring to FIG. 3, the reading operation to the byte corresponding to CG1, CG2, WL1 and BL1-BL8 may be performed as follows.

applying a voltage of 0V to BL1-BL8;
applying a voltage of 0.8V to BL1'-BL8';
applying a voltage of 0V to CG1;
applying a voltage of 4V to CG2;
applying a voltage of 4.5V to WL1;
applying a voltage of 0V to CG3 and CG4; and
applying a voltage of 0V to WL2.

The present disclosure further provides another memory array including a plurality of memory units arranged in M rows and N columns, 2N bit lines, where M≥1, N≥1, and N is an integer multiple of 8. For the memory units in the $n^{th}$ column, where 1≤n≤N, their bit line structures are respectively connected to two bit lines in the memory array. For the memory units in the same row, their word line structures are connected to the same word line in the memory array, their control gates are connected to the same control gate line in the memory array, and their semiconductor substrates are connected to the same substrate line.

Figure 4:
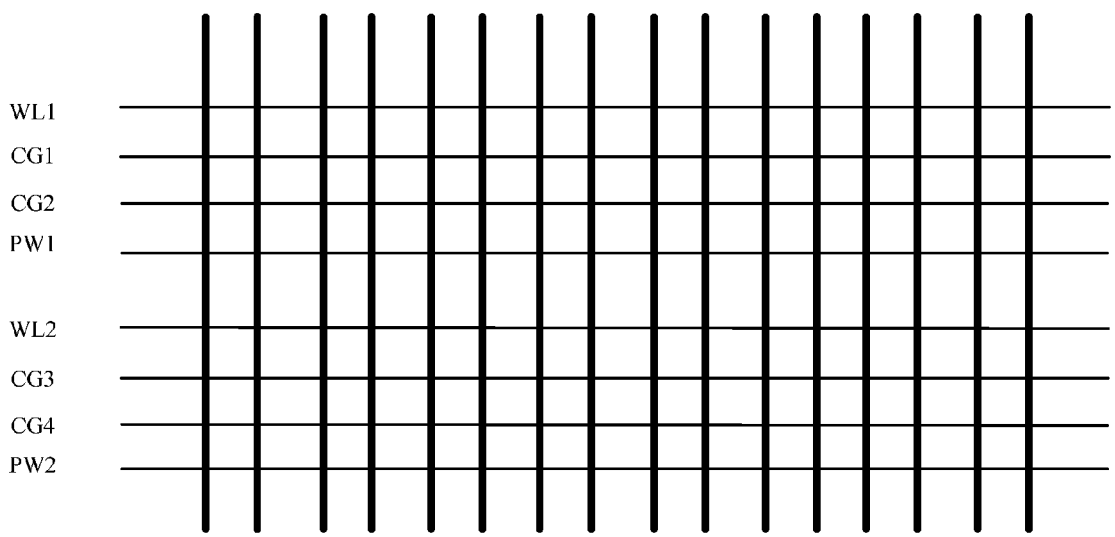
FIG. 4 schematically illustrates a memory array according to another embodiment of the present disclosure.

Specifically, FIG. 4 schematically illustrates a memory array including memory units arranged in 2 rows and 8 columns, 16 bit lines BL1-BL8 and BL1'-BL8', 4 control gate lines CG1-CG4, 2 word lines WL1 and WL2, and 2 substrate lines PW1 and PW2. Connections of the bit lines, control gate lines and word lines are the same as those illustrated in FIG. 3, which will not be illustrated here. The difference lies in that the memory array in FIG. 4 further includes PW1 connected with the semiconductor substrates in the memory units in the first row, and PW2 connected with the semiconductor substrates in the memory units in the second row.

The programming, erasing and reading operations to the memory array in FIG. 3 are also applicable to the memory array in FIG. 4.

Further, the present disclosure provides another memory array including a plurality of memory units arranged in M rows and N columns, 2N bit lines, where M≥1, N≥1, and N is an integer multiple of 8. For the memory units in the $n^{th}$ column, where 1≤n≤N, their bit line structures are respectively connected to two bit lines in the memory array. For the memory units in the same row, their word line structures are connected to the same word line in the memory array, their control gates are connected to the same control gate line in the memory array, and their semiconductor substrates are connected to the same substrate line. The erasing method for the memory array may be performed as follows.

applying a voltage of −2V to bit lines connected with bit line structures in memory units to be erased;

applying a voltage of −7V to control gate lines connected with control gates in the memory units to be erased;

applying a voltage of 8V to word lines connected with word line structures in the memory units to be erased;

applying a voltage of −2V to substrate lines connected with semiconductor substrates in the memory units to be erased;

applying a voltage of 0V to bit lines which are not connected with the bit line structures in the memory units to be erased;

applying a voltage of 0V to control gate lines which are not connected with the control gates in the memory units to be erased; and applying a voltage of 0V to word lines which are not connected with the word line structures in the memory units to be erased.

Specifically, referring to FIG. 4, the erasing operation to the byte corresponding to CG1, CG2, WL1 and BL1-BL8 may be performed as follows.

applying a voltage of −2V to BL1-BL8, and BL1'-BL8';
applying a voltage of −7V to CG1 and CG2;
applying a voltage of 8V to WL1;
applying a voltage of −2V to PW1;
applying a voltage of 0V to CG3 and CG4; and
applying a voltage of 0V to WL2.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A memory array comprising:
a plurality of memory units arranged in M rows and N columns,
2N bit lines,
M word lines, and
2M control lines, wherein:
M≥1;
N≥1;
N is an integer multiple of 8;
wherein, for each memory unit of the plurality of memory units:
the memory unit is a flash memory unit including a semiconductor substrate, a first bit line structure, a second bit line structure, a word line structure, a first float gate, a second float gate, a first control gate, and a second control gate;

the semiconductor substrate includes a first doping well and a second doping well formed in the semiconductor substrate, the first doping well and the second doping well respectively constituting a source and a drain;

the first bit line structure and the second bit line structure are disposed on the semiconductor substrate and respectively connected with the source and the drain;

the word line structure is disposed on the semiconductor substrate and between the first bit line structure and the second bit line structure;

the first float gate is disposed on the semiconductor substrate and between the first bit line structure and the word line;

the second float gate is disposed on the semiconductor substrate and between the second bit line structure and the word line;

the first control gate is disposed on the first float gate;

the second control gate is disposed on the second float gate;

wherein, for each of the memory units in an $n^{th}$ column, the first bit line structure and the second bit line structure are respectively connected to two of the 2N bit lines wherein $1 \leq n \leq N$; and wherein, each of the memory units in the same row, the word line structure is connected to one of the M word lines in the memory array, and the first control gate and the second control gate are respectively connected to two of the 2M control lines.

2. The memory array according to claim 1, further comprising M substrate lines each of which is connected to the semiconductor substrates in the memory units in the same row.

3. An erasing method of the memory array according to claim 2, the method comprising:

applying a voltage of −2V to bit lines connected with bit line structures in memory units to be erased;

applying a voltage of −7V to control gate lines connected with control gates in the memory units to be erased;

applying a voltage of 8V to word lines connected with word line structures in the memory units to be erased;

applying a voltage of −2V to substrate lines connected with semiconductor substrates in the memory units to be erased;

applying a voltage of 0V to bit lines that are not connected with the bit line structures in the memory units to be erased;

applying a voltage of 0V to control gate lines that are not connected with the control gates in the memory units to be erased; and applying a voltage of 0V to word lines that are not connected with the word line structures in the memory units to be erased.

4. A programming method of the memory array according to claim 1, the method comprising:

applying a voltage ranging from 4V to 6V to bit lines connected with bit line structures to be programmed in memory units to be programmed;

applying a current ranging from 1 µA to 5 µA to bit lines connected with bit line structures not to be programmed in the memory units to be programmed;

applying a voltage of 8V to control gate lines connected with control gates disposed besides the bit line structures to be programmed in the memory units to be programmed;

applying a voltage of 5V to control gate lines connected with control gates disposed besides the bit line structures not to be programmed in the memory units to be programmed;

applying a voltage of 1.5V to word lines connected with word line structures in the memory units to be programmed;

applying a voltage of 0V to bit lines that are not connected with the bit line structures in the memory units to be programmed;

applying a voltage of 0V to control gate lines that are not connected with the control gates in the memory units to be programmed; and applying a voltage of 0V to word lines that are not connected with the word line structures in the memory units to be programmed.

5. An erasing method of the memory array according to claim 1, the method comprising:

applying a voltage of 0V to bit lines connected with bit line structures in memory units to be erased;

applying a voltage of −7V to control gate lines connected with control gates in the memory units to be erased;

applying a voltage of 8V to word lines connected with word line structures in the memory units to be erased;

applying a voltage of 0V to bit lines that are not connected with the bit line structures in the memory units to be erased;

applying a voltage of 0V to control gate lines that are not connected with the control gates in the memory units to be erased; and applying a voltage of 0V to word lines that are not connected with the word line structures in the memory units to be erased.

6. A reading method of the memory array according to claim 1, the method comprising:

applying a voltage of 0V to bit lines connected with bit line structures to be read in memory units to be read;

applying a voltage of 0.8V to bit lines connected with bit line structures not to be read in the memory units to be read;

applying a voltage of 0V to control gate lines connected with control gates disposed besides the bit line structures to be read in the memory units to be read;

applying a voltage of 4V to control gate lines connected with control gates disposed besides the bit line structures not to be read in the memory units to be read;

applying a voltage of 4.5V to word lines connected with word line structures in the memory units to be read;

applying a voltage of 0V to bit lines that are not connected with the bit line structures in the memory units to be read;

applying a voltage of 0V to control gate lines that are not connected with the control gates in the memory units to be read; and applying a voltage of 0V to word lines that are not connected with the word line structures in the memory units to be read.

7. The method according to claim 6, wherein the bit line structure to be read in each of the memory units to be read is selected from the first bit line structure and the second bit line structure.

* * * * *